United States Patent
Yoshida et al.

(10) Patent No.: US 8,824,043 B2
(45) Date of Patent: Sep. 2, 2014

(54) OPTICAL OUTPUT LEVEL CONTROL APPARATUS

(71) Applicant: Fujitsu Limited, Kawasaki (JP)

(72) Inventors: Setsuo Yoshida, Inagi (JP); Taku Yoshida, Kurate (JP); Keisuke Harada, Fukuoka (JP); Yutaka Kai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/949,348

(22) Filed: Jul. 24, 2013

(65) Prior Publication Data

US 2014/0078579 A1    Mar. 20, 2014

(30) Foreign Application Priority Data

Sep. 14, 2012  (JP) ................................. 2012-202515

(51) Int. Cl.
*H01S 3/131*   (2006.01)

(52) U.S. Cl.
USPC ..................................... 359/337; 359/341.42

(58) Field of Classification Search
USPC ........................................... 359/337, 341.42
See application file for complete search history.

(56) References Cited

U.S. PATENT DOCUMENTS

| | | | |
|---|---|---|---|
| 6,452,715 B1 * | 9/2002 | Friedrich | 359/334 |
| 6,577,438 B2 * | 6/2003 | Sugawara et al. | 359/337.11 |
| 2002/0141044 A1 * | 10/2002 | Sugawara et al. | 359/337.11 |
| 2009/0322233 A1 | 12/2009 | Sone | |
| 2011/0254608 A1 | 10/2011 | Kai et al. | |

FOREIGN PATENT DOCUMENTS

| | | |
|---|---|---|
| JP | 4-84056 | 3/1992 |
| JP | 2004-179233 | 6/2004 |
| JP | 2010-10614 | 1/2010 |
| JP | 2012-70353 | 4/2012 |

* cited by examiner

*Primary Examiner* — Mark Hellner
(74) *Attorney, Agent, or Firm* — Staas & Halsey LLP

(57) ABSTRACT

An optical output level control apparatus includes a detector configured to detect power of an input optical signal; an amplifier configured to amplify the input optical signal; a memory configured to store data that define a first curved line representing a relationship between the input power and a drive voltage of the amplifier for obtaining a first output level and data that defines a second curved line representing a relationship between the input power and the drive voltage of the amplifier for obtaining a second output level; a generator configured to correct at least one of the first and second curved lines and generate a target curved line representing a relationship between input power and a drive voltage of the amplifier for obtaining a target output level through interpolation based on the first and second curved lines at least one of which is corrected.

6 Claims, 16 Drawing Sheets

FIG. 4

TARGET OUTPUT LEVEL: 10 [dBm]

| INPUT PD VALUE (OPTICAL INPUT POWER) | DRIVE VOLTAGE VALUE |
|---|---|
| 0 | 8191 |
| 1 | 8191 |
| 2 | 7922 |
| ... | ... |
| ... | ... |
| ... | ... |
| 4094 | 358 |
| 4095 | 296 |

100a

TARGET OUTPUT LEVEL: 9 [dBm]

| INPUT PD VALUE (OPTICAL INPUT POWER) | DRIVE VOLTAGE VALUE |
|---|---|
| 0 | |
| 1 | |
| 2 | |
| ... | |
| ... | |
| ... | |
| 4094 | |
| 4095 | |

100b

TARGET OUTPUT LEVEL: −10 [dBm]

| INPUT PD VALUE (OPTICAL INPUT POWER) | DRIVE VOLTAGE VALUE |
|---|---|
| 0 | |
| 1 | |
| 2 | |
| ... | |
| ... | |
| ... | |
| 4094 | |
| 4095 | |

| INPUT PD VALUE | OUTPUT LEVEL: 10 [dBm]<br>DRIVE VOLTAGE VALUE |
|---|---|
| 0 | — |
| 500 | — |
| 1000 | 8191 |
| 1500 | 7200 |
| 2000 | 6600 |
| 2500 | ... |
| 4095 | 5800 |

FIG. 10B

| INPUT PD VALUE | OUTPUT LEVEL: −10 [dBm]<br>DRIVE VOLTAGE VALUE |
|---|---|
| 0 | — |
| 500 | 5900 |
| 1000 | 5000 |
| 1500 | 4350 |
| 2000 | 4200 |
| 2500 | 4150 |
| ... | ... |
| 4095 | 4100 |

FIG. 11

| OUTPUT LEVEL [dBm] | COORDINATES OF UPPER LEFT END POINT ||  COORDINATES OF LOWER RIGHT END POINT ||
| --- | --- | --- | --- | --- |
|  | INPUT PD VALUE | DRIVE VOLTAGE VALUE | INPUT PD VALUE | DRIVE VOLTAGE VALUE |
| +10 | 1500 | 8191 | 4095 | 5800 |
| +8 | 1100 | 8191 | 4095 | 5600 |
| +6 | 700 | 8191 | 4095 | 5200 |
| +4 | 500 | 7600 | 4095 | 4900 |
| +2 | 500 | 7200 | 4095 | 4600 |
| .. | .. | .. | .. | .. |
| .. | .. | .. | .. | .. |
| −10 | 500 | 5900 | 4095 | 4100 |

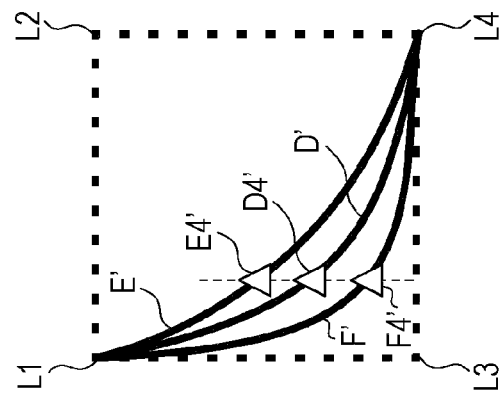
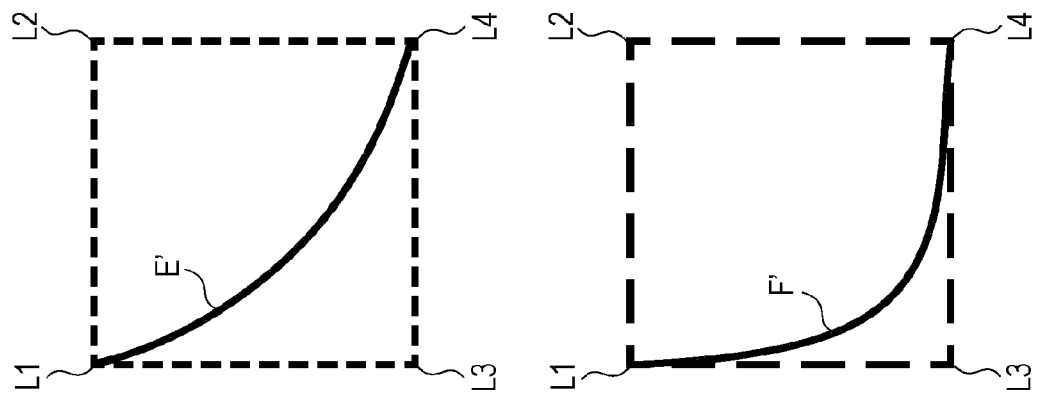
FIG. 14

OPTICAL OUTPUT LEVEL CONTROL APPARATUS

CROSS-REFERENCE TO RELATED APPLICATION

This application is based upon and claims the benefit of priority of the prior Japanese Patent Application No. 2012-202515, filed on Sep. 14, 2012, the entire contents of which are incorporated herein by reference.

FIELD

The embodiments discussed herein are related to an apparatus for controlling an optical output level.

BACKGROUND

In many cases, it is desirable that optical transmission apparatuses transmit an optical signal at a predetermined target output level that is within a reception dynamic range of an optical receiver. To meet such a demand, the optical transmission apparatus has a function of dynamically controlling the gain of an optical amplifier in accordance with the power of an input optical signal (hereinafter referred to as an "output level control function").

Through the output level control function, a drive voltage used for controlling the gain of an optical amplifier is generated in accordance with the optical input power. At that time, in order to provide high-speed response, the output level control function is realized using a configuration that employs, for example, a lookup table. In such a case, the lookup table is generated on the basis of the properties of the optical amplifier in advance. For example, the lookup table stores the correspondence relationship between an optical input power and a drive voltage of the optical amplifier for a predetermined target output level. Thereafter, through the output level control function, a drive voltage corresponding to a given optical input power is acquired from the lookup table, and control is performed on the gain of the lookup table using the acquired drive voltage. In this manner, the output level of the optical amplifier can be maintained at the target output level.

As a related art, a semiconductor optical amplifier apparatus having an output control function has been developed. In addition, an output beam intensity control apparatus that controls the intensity of an output beam so that the intensity is maintained at a certain level has been developed. Furthermore, a method for performing more flexible control by outputting data in a generated table and performing linear interpolation on the data has been developed (refer to, for example, Japanese Laid-open Patent Publication Nos. 2004-179233, 2010-10614, and 4-84056).

The above-described lookup table is generated by measuring, for each of the target output levels, the drive voltage at which the target output level is obtained while sweeping the optical input power. At that time, the target output level varies on a user-by-user basis. Accordingly, to satisfy the demand of each user, a plurality of lookup tables are generated in advance. In addition, to increase the dynamic range of the optical input power, the measurement is performed for each of a plurality of target output levels. Thus, in order to generate a general-purpose lookup table, a time for measurement is increased and, therefore, the cost for generating the lookup table is increased.

Such an issue can be addressed by, for example, reducing the number of measurement points when the lookup table is generated and computing data corresponding to predetermined target output levels using linear interpolation. However, in widely used linear interpolation, an error in the computed data (e.g., the drive voltage of the optical amplifier corresponding to the optical input power) increases. In such a case, the optical output level may be shifted from the target output level. In addition, depending on the properties of an optical detector that detects the optical input power and/or an optical amplifier that amplifies the drive voltage, a region in which an element of the lookup table is difficult to compute using linear interpolation appears. That is, for a desired target output level, it is difficult to obtain a correspondence relationship between the optical input power and the drive voltage of the optical amplifier. In such a case, the dynamic range of the optical input power is reduced, or the accuracy of control of the optical output level is reduced.

SUMMARY

According to an aspect of the embodiment, an optical output level control apparatus includes a detector configured to detect power of an input optical signal; an amplifier configured to amplify the input optical signal; a memory configured to store data that define a first curved line representing a relationship between the input power and a drive voltage of the amplifier for obtaining a first output level and data that defines a second curved line representing a relationship between the input power and the drive voltage of the amplifier for obtaining a second output level; a generator configured to correct at least one of the first and second curved lines and generate a target curved line representing a relationship between input power and a drive voltage of the amplifier for obtaining a target output level through interpolation based on the first and second curved lines at least one of which is corrected.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 illustrates an example of a lookup table;

FIGS. 10A and 10B illustrate an example of the measurement data corresponding to a fixed output level curved line;

FIG. 11 illustrates an example of the measurement data indicating the end points of the fixed output level curved line;

FIG. 14 illustrates interpolation operation;

DESCRIPTION OF EMBODIMENTS

Figure 1:
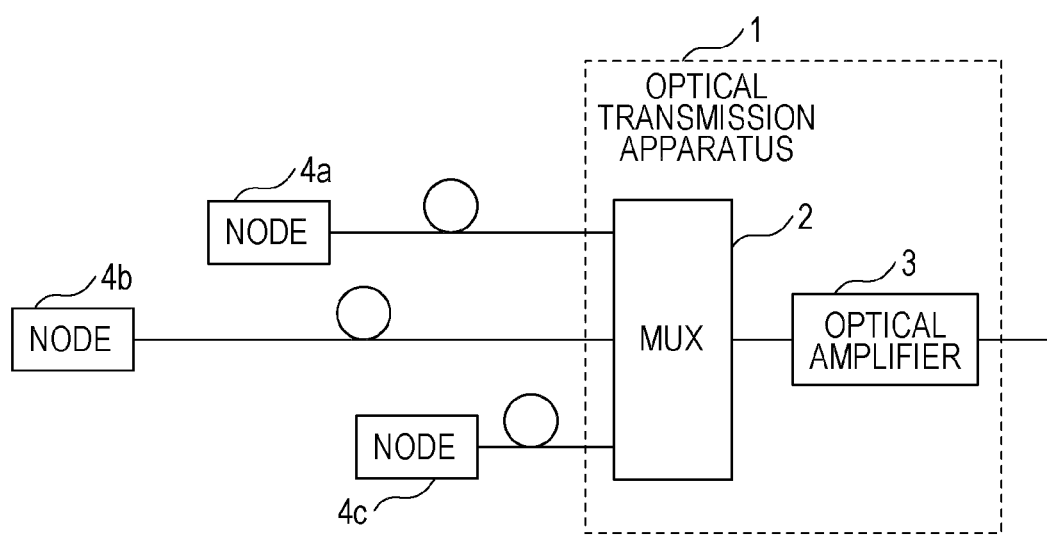
FIG. 1 illustrates an example of a transmission system including an optical transmission apparatus according to an exemplary embodiment.

FIG. 1 illustrates an example of a transmission system including an optical transmission apparatus according to an exemplary embodiment of the present disclosure. In the example illustrated in FIG. 1, an optical transmission apparatus 1 has a plurality of optical nodes 4a to 4c connected thereto. The optical transmission apparatus 1 is connected to each of the optical nodes 4a to 4c via an optical fiber.

The optical transmission apparatus 1 includes a multiplexer (MUX) 2 and an optical amplifier 3. Herein, the multiplexer 2 is formed from, for example, an optical coupler. The multiplexer 2 multiplexes optical signals transmitted from the optical nodes 4a to 4c using a time division multiplexing technique. The optical amplifier 3 amplifies the multiplexed optical signal output from the multiplexer 2. The optical transmission apparatus 1 transmits the amplified optical signal to, for example, a destination node.

According to the present exemplary embodiment, the distances from each of the optical nodes 4a to 4c to the optical transmission apparatus 1 differ from one another. Accordingly, even when the transmission powers of the optical nodes 4a to 4c are the same, the powers of the optical signals received by the optical transmission apparatus 1 from the optical nodes 4a to 4c are not the same at all times.

Note that the optical transmission apparatus 1 may have another function in addition to the function illustrated in FIG. 1. For example, the optical transmission apparatus 1 may have a function of transmitting an optical signal to each of the optical nodes 4a to 4c. Furthermore, the optical transmission apparatus 1 may amplify an optical signal transmitted from a client.

Figure 2:
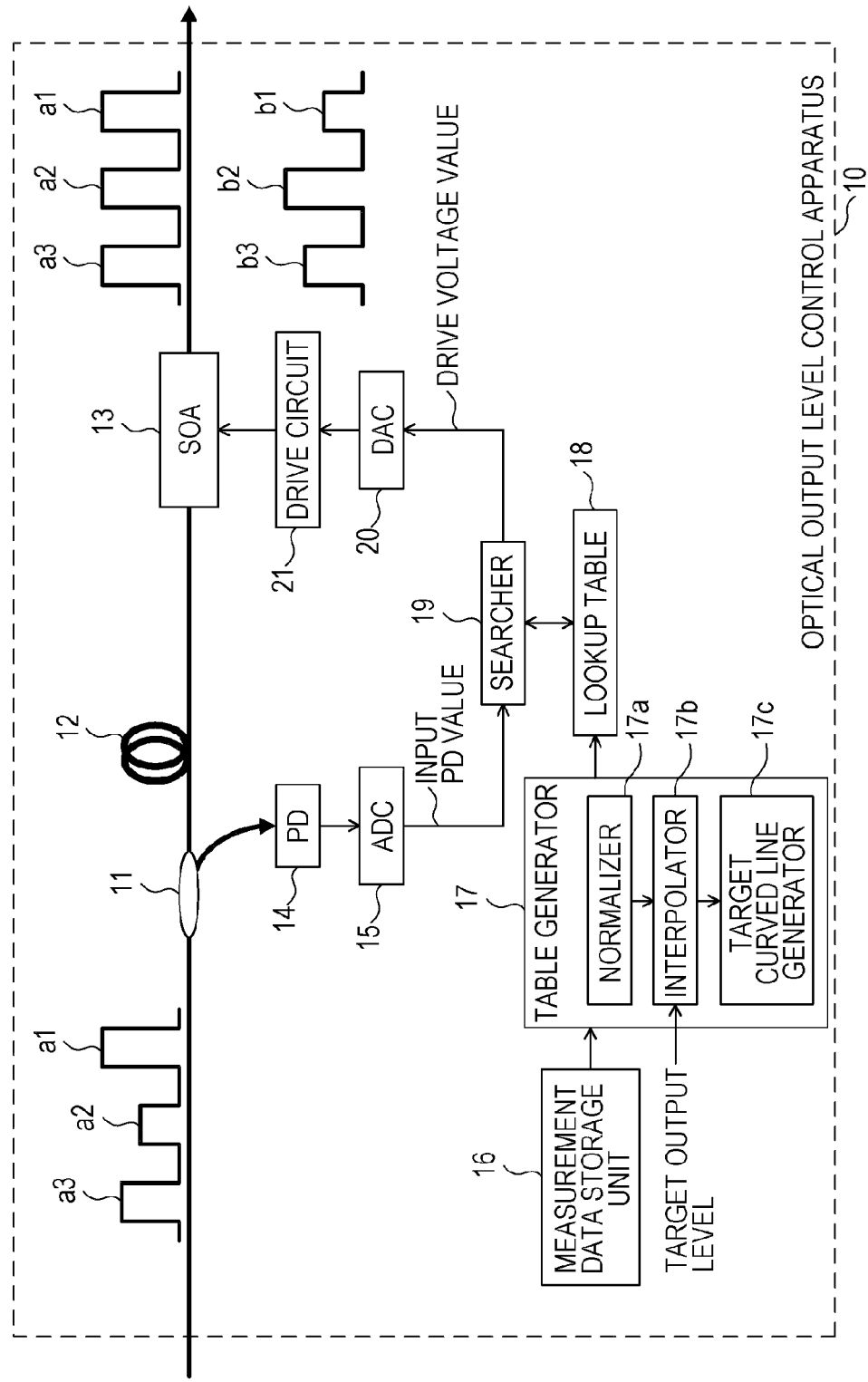
FIG. 2 illustrates an exemplary configuration of an optical output level control apparatus according to the exemplary embodiment.

FIG. 2 illustrates an exemplary configuration of an optical output level control apparatus according to the present exemplary embodiment. For example, as illustrated in FIG. 2, an optical output level control apparatus 10 is disposed between the multiplexer (MUX) 2 of the optical transmission apparatus 1 and the optical amplifier 3 illustrated in FIG. 1. If the optical transmission apparatus 1 does not include the optical amplifier 3 and includes only the multiplexer (MUX) 2, an optical signal output from the multiplexer 2 illustrated in FIG. 1 is led to the optical output level control apparatus 10. Note that the optical output level control apparatus 10 may be disposed at any position between the output side of the multiplexer (MUX) 2 and an optical receiver, instead of being disposed in the optical transmission apparatus 1.

The optical output level control apparatus 10 includes an optical coupler 11, a delay line 12, a semiconductor optical amplifier (SOA) 13, a photodetector (PD) 14, an analog-to-digital (A/D) converter 15, a measurement data storage unit 16, a table generator 17, a lookup table 18, a searcher 19, a digital-to-analog (D/A) converter 20, and a drive circuit 21. The optical output level control apparatus 10 amplifies an input optical signal to the target output level and outputs an optical signal.

The optical coupler 11 branches the input optical signal and leads branched optical signals to the semiconductor optical amplifier 13 and the photodetector 14. That is, the optical coupler 11 is used as an optical splitter. The branch ratio of the optical coupler 11 is not limited to any particular ratio. However, most of the optical power of the input optical signal is led to the semiconductor optical amplifier 13.

The delay line 12 is disposed between the optical coupler 11 and the semiconductor optical amplifier 13. That is, one of the optical signals output from the optical coupler 11 is led to the semiconductor optical amplifier 13 via the delay line 12. In this example, the delay line 12 is formed from an optical fiber. In such a case, the length of the delay line 12 is designed such that an amount of time over which the optical signal travels in the delay line 12 is equal to the sum of the operating times of the photodetector 14, the A/D converter 15, the searcher 19, the D/A converter 20, and the drive circuit 21.

The semiconductor optical amplifier 13 amplifies the input optical signal. The gain of the semiconductor optical amplifier 13 is controlled by the drive voltage supplied from the drive circuit 21.

Figure 3:
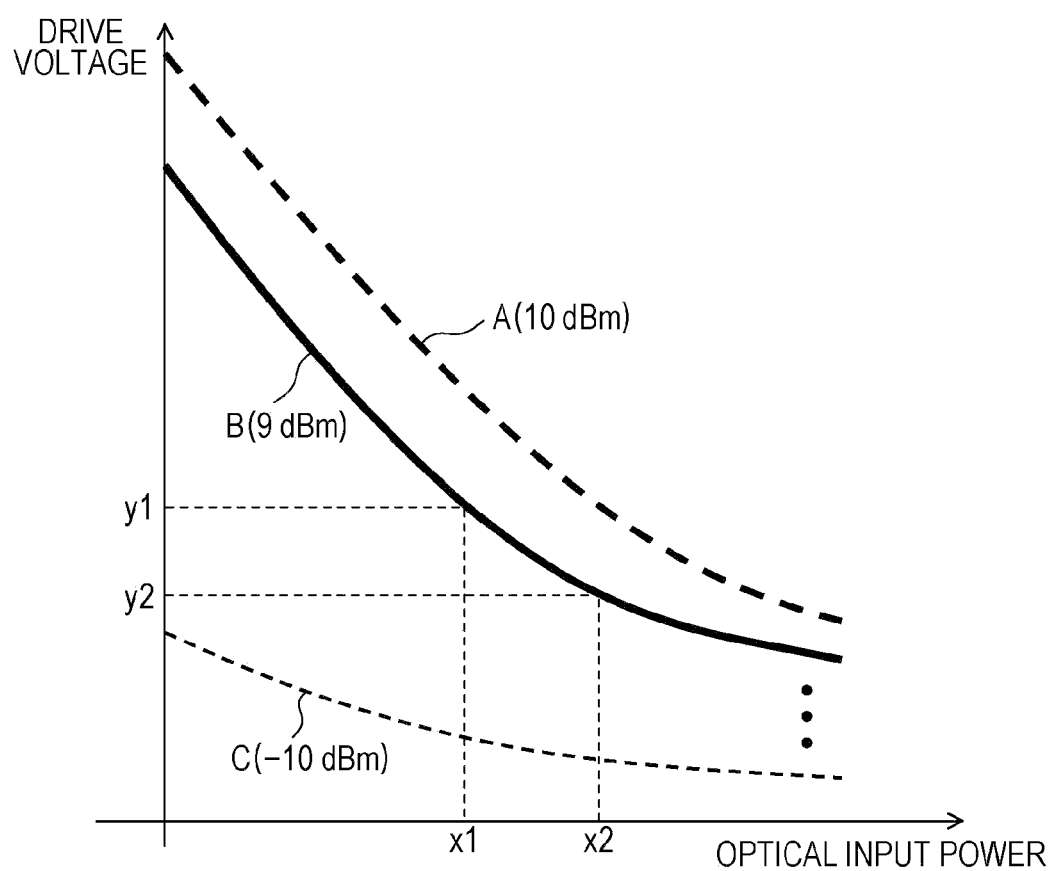
FIG. 3 illustrates an example of the properties of an optical amplifier.

FIG. 3 illustrates a relationship among the optical input power, the drive voltage, and the optical output level of the semiconductor optical amplifier 13. In FIG. 3, the abscissa represents the optical input power, and the ordinate represents the drive voltage of the semiconductor optical amplifier 13. Curved lines A, B, and C indicate a relationship between the optical input power and the drive voltage of the semiconductor optical amplifier 13 at optical output levels of 10 dBm, 9 dBm, and −10 dBm, respectively. As used herein, the term "optical output level" refers to the level of an optical output power of only signal light obtained by subtracting the optical output power of noise of the semiconductor optical amplifier 13 (i.e., amplified spontaneous emission (ASE)) from the original optical output power. In the example illustrated in FIG. 3, when the optical input power is x1 and if a drive voltage is controlled to y1, "the optical output level=9 dBm" can be obtained. In addition, when the optical input power is x2 and if a drive voltage is controlled to y2, "the optical output level=9 dBm" can be obtained. That is, if the target output level is specified, the value of the drive voltage of the semiconductor optical amplifier 13 can be uniquely determined for the optical input power.

The photodetector 14 converts the input optical signal into an electric signal. The electric signal indicates the power of the input optical signal. That is, the photodetector 14 detects the optical input power of the optical output level control apparatus 10. Note that the photodetector 14 includes, for example, a photodiode. In such a case, the photodetector 14 may further include a circuit that converts an electric current signal generated by the photodiode into a voltage signal.

The A/D converter 15 converts the output signal of the photodetector 14 into a digital signal. The digital signal indicates the optical input power of the optical output level control apparatus 10. Note that the digital signal indicating the optical input power detected by the photodetector 14 may be also referred to as an "input PD value".

The measurement data storage unit 16 stores data that define the first curved line and the second curved line. The first curved line indicates the relationship between the optical input power and the drive voltage of the semiconductor optical amplifier 13 for obtaining a first optical output level. The second curved line indicates the relationship between the optical input power and the drive voltage of the semiconductor optical amplifier 13 for obtaining a second optical output level. The measurement data storage unit 16 further stores measurement data indicating the end points of each of the curved lines representing the relationship between the optical input power and the drive voltage of the semiconductor optical amplifier 13. The first curved line, the second curved line, and the measurement data indicating the end points are described in more detail below. Note that the measurement data storage unit 16 is formed from, for example, a semiconductor memory.

The table generator 17 generates the lookup table 18 on the basis of the specified target output level. At that time, the table generator 17 generates a lookup table 18 corresponding to the specified target output level using the above-described first curved line and second curved line. The target output level is an output light level maintained by the semiconductor optical amplifier 13. For example, if, in the exemplary embodiment illustrated in FIG. 3, "the target output level=9 dBm" is given, the lookup table 18 that defines the curved line B is generated. Note that for example, the target output level is specified by a user of the optical transmission apparatus 1 illustrated in FIG. 1 or a user of a network including the optical transmission apparatus 1. In addition, the lookup table 18 is formed using, for example, a semiconductor memory.

The table generator 17 includes a normalizer 17a, an interpolator 17b, and a target curved line generator 17c. The functions of the normalizer 17a, the interpolator 17b, and the target curved line generator 17c are described in more detail below.

The table generator 17 is formed from, for example, a processor (including a digital signal processor (DSP)). In such a case, the function of the table generator 17 is realized by the processor executing a program. Alternatively, the table generator 17 may be formed from a hardware circuit.

The searcher 19 refers to the lookup table 18 and determines a drive voltage corresponding to the optical input power. As described above, the optical input power is detected by the photodetector 14. That is, the searcher 19 determines the drive voltage corresponding to the optical input power detected by the photodetector 14. The determining operation performed by the searcher 19 involves the operation of searching the lookup table and extracting corresponding data. Note that the searcher 19 is formed from, for example, a hardware circuit that searches the lookup table 18. Alternatively, the searcher 19 may be formed using a processor.

The D/A converter 20 converts a digital signal representing a drive voltage value determined by the searcher 19 into an analog signal. The drive circuit 21 drives the semiconductor optical amplifier 13 on the basis of an analog signal generated by the D/A converter 20. That is, the semiconductor optical amplifier 13 is driven by the drive voltage corresponding to the optical input power.

The optical output level control apparatus 10 having the above-described configuration sequentially receives optical signals a1, a2, and a3. The optical signals a1, a2, and a3 may be, but are not limited to, packet signals transmitted from different optical nodes. In FIG. 2, the heights of the optical signals a1, a2, and a3 represent the optical power. The target output level is specified by the user. The lookup table 18 stores data used for providing the target output level (i.e., data defining the relationship between the optical input power and the drive voltage of the semiconductor optical amplifier 13).

If the optical signal a1 is input, the searcher 19 refers to the lookup table 18 and identifies a drive voltage b1 corresponding to the optical power of the optical signal a1. Thereafter, the drive circuit 21 drives the semiconductor optical amplifier 13 using the drive voltage b1. As a result, the power of the optical signal a1 output from the semiconductor optical amplifier 13 is controlled to the target output level. Note that in FIG. 2, the heights b1 to b3 represent the voltages.

Similarly, if the optical signal a2 is input, the drive circuit 21 drives the semiconductor optical amplifier 13 using the drive voltage b2. In addition, if the optical signal a3 is input, the drive circuit 21 drives the semiconductor optical amplifier 13 using the drive voltage b3. Accordingly, even when the optical input powers of the optical signals a1, a2, and a3 differ from one another, the optical output levels of the optical signals a1, a2, and a3 are controlled to a certain target output level.

In this manner, the optical output level control apparatus 10 feedforward controls the drive voltage of the semiconductor optical amplifier 13 on the basis of the optical input power. Accordingly, even when the optical input power rapidly varies, the optical output level control apparatus 10 can follow the variation and control the optical power of an output optical signal. It is to be noted that the present disclosure is not limited to a technique for feedforward-controlling the drive voltage on the basis of the optical input power.

Background of Technology

Before describing a technique for generating the lookup table 18 according to the exemplary embodiment of the present disclosure, the background of the lookup table technology is described. Note that the following background of the lookup table technology is provided for ease of understanding of the embodiments of the present disclosure, and the following lookup table technology is not an existing or widely used technology.

FIG. 4 illustrates an example of the lookup table. In the example illustrated in FIG. 4, a lookup table group 100 includes a plurality of lookup tables 100a to 100n. The lookup tables 100a to 100n are provided so as to correspond to the target output levels (10 dBm, 9 dBm, . . . , −10 dBm), respectively. Each of the lookup tables 100a to 100n stores a correspondence relationship between the optical input power and the drive voltage of the optical amplifier. This correspondence relationship represents the properties of the optical amplifier.

Assume that in the optical output level control apparatus 10 illustrated in FIG. 2, the lookup table group 100 illustrated in FIG. 4 is used. Then, one of the lookup tables is selected on the basis of the target output level specified by the user, and the semiconductor optical amplifier 13 is controlled using the selected lookup table. For example, if "the target output level=10 dBm" is selected by the user, the semiconductor optical amplifier 13 is controlled by using the lookup table 100a.

Figure 5:
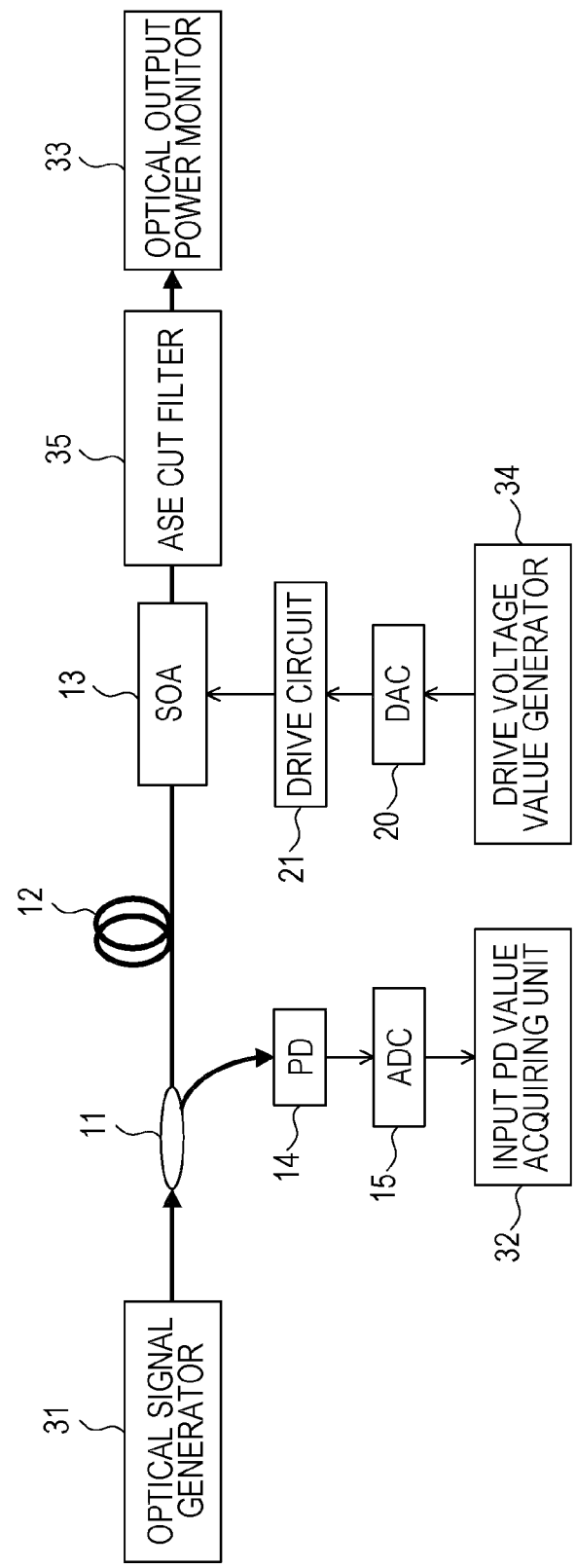
FIG. 5 illustrates an example of a measuring system that collects data used to generate the lookup table.

FIG. 5 illustrates an example of a measuring system for generating the lookup table. The measuring system includes an optical signal generator 31, an input PD value acquiring unit 32, an optical output power monitor 33, and a drive voltage value generator 34. The optical signal generator 31 can generate an optical signal having desired power. The input PD value acquiring unit 32 acquires an input PD value (i.e., a digital signal indicating the optical input power detected by the photodetector 14). An ASE cut filter 35 removes an AES component from input light and outputs only the signal light. The optical output power monitor 33 monitors the optical output power of only the signal light after the AES component is removed from the power of the output optical signal of the semiconductor optical amplifier 13 using the ASE cut filter 35 (i.e., the optical output level). The drive voltage value generator 34 can generate a desired drive voltage value.

As an example, a sequence of generating the lookup table 100a corresponding to "the output level=10 dBm" is described below. In such a case, the optical signal generator 31 is controlled so that the input PD value acquiring unit 32 sequentially detects input PD values of 0, 1, 2, . . . 4095. Thereafter, at each of measurement points, that is, for each of the input PD values, the drive voltage value generator 34 is controlled so that the optical output level detected by the optical output power monitor 33 is "10 dBm". In this manner, at each of the measurement points (4096 measurement points in the above-described example), measurement data indicating the relationship between the optical input power and the drive voltage of the semiconductor optical amplifier 13 is collected.

The above-described measurement is performed for each of the output levels. In the example illustrated in FIG. 4, the measurement data are collected in the range from 10 dBm to −10 dBm. As a result, the lookup tables 100a to 100n are generated.

Note that the target output level varies on a user-by-user basis. Accordingly, to meet demands of various users using a general-purpose lookup table, a plurality of the lookup table are generated in advance. Thus, to generate a general-purpose lookup table, a period of time for collecting the above-described measurement data is increased and, therefore, the cost for generating the lookup table increases.

Such an issue can be addressed by, for example, reducing the number of measurement points for generating the lookup table and computing data items corresponding to the specified target output level using linear interpolation. For example, in the example illustrated in FIG. 6, measurement data defining the correspondence relationship between the optical input power and the drive voltage of the semiconductor optical amplifier 13 are collected for each of two levels (10 dBm and −10 dBm). That is, two measurement data tables 41 and 42 are generated. Note that in FIG. 6, measurement is not performed for shaded areas.

As can be seen from a comparison of each of the measurement data tables 41 and 42 and each of the lookup tables 100a to 100n illustrated in FIG. 4, the increment of the input PD value (or the optical input power) for measurement in the measurement data tables 41 and 42 is larger than that in the lookup tables 100a to 100n. In the example illustrated in FIG. 4, the drive voltage values corresponding to the input PD values of 0, 1, 2, . . . 4095 are measured, as described above. In contrast, in the example illustrated FIG. 6, the drive voltage values corresponding to the input PD values of 0, 100, 200, . . . 4000, and 4095 are measured.

Figure 6:
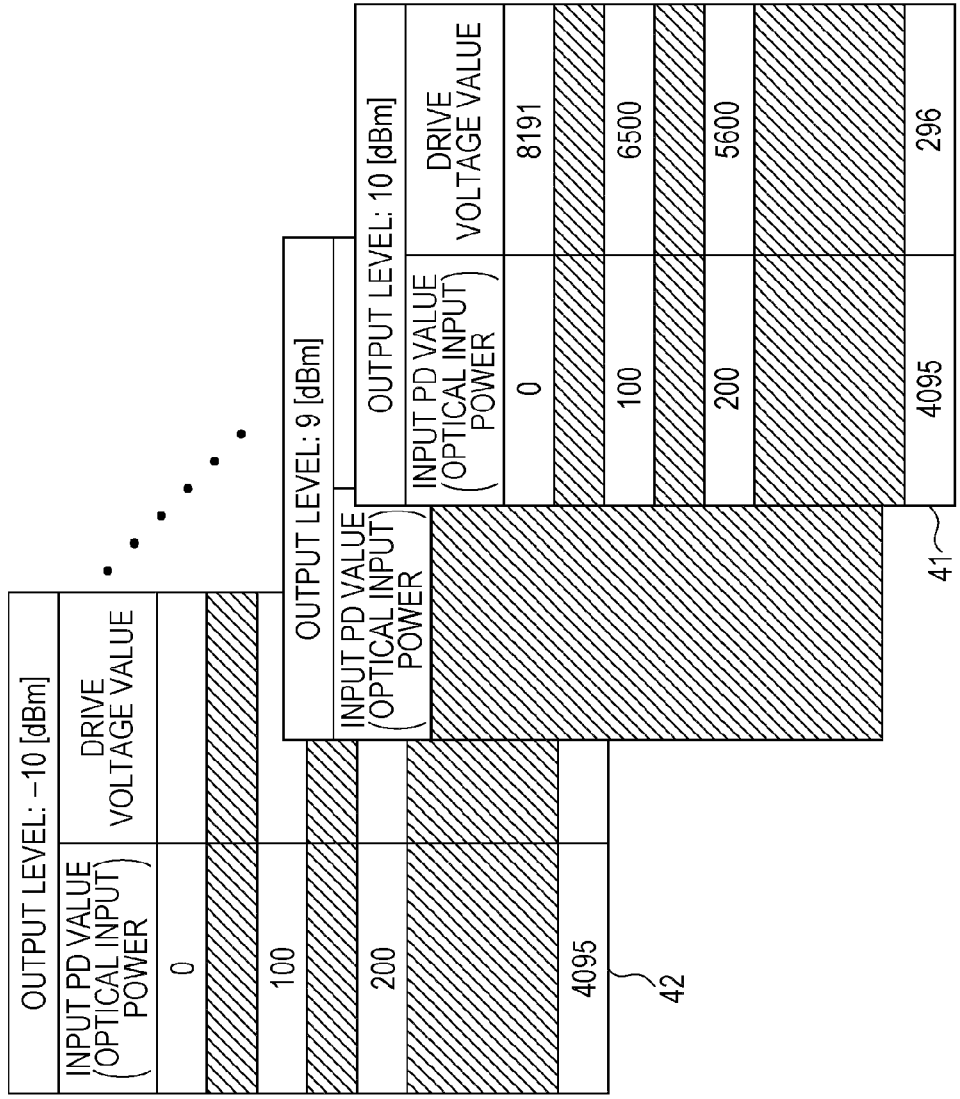
FIG. 6 illustrates an example of measurement data.
Figure 7:
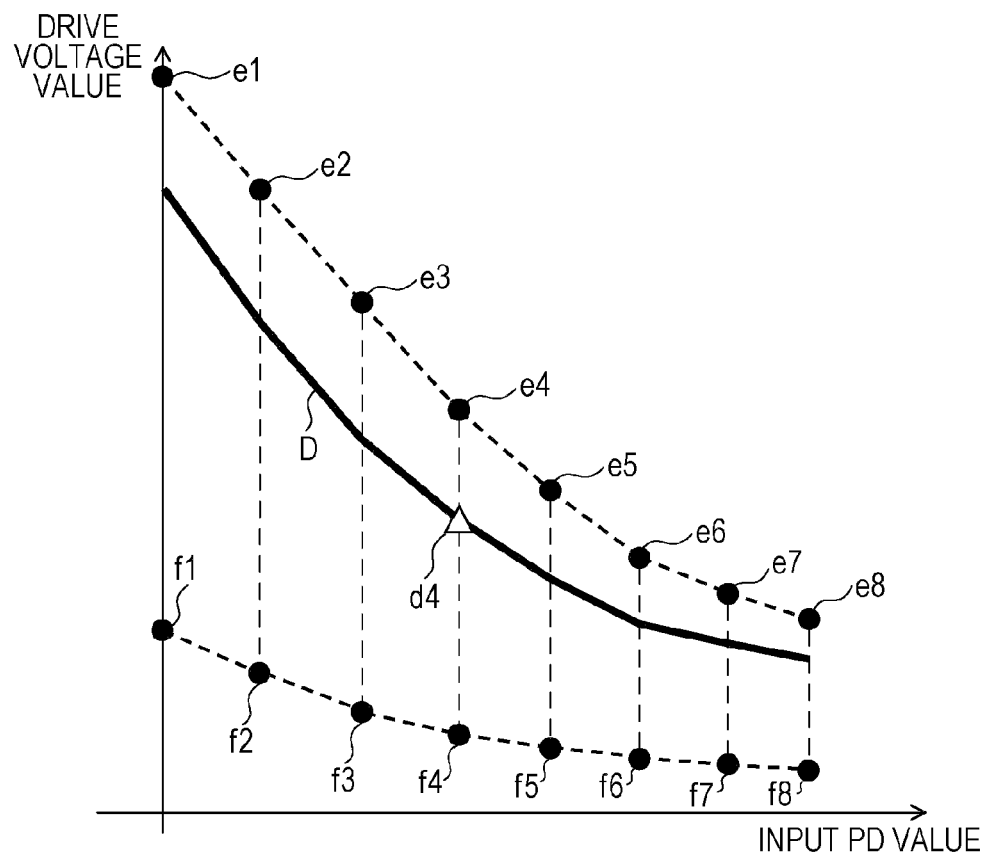
FIG. 7 illustrates a method for generating the lookup table through linear interpolation.

FIG. 7 illustrates a method for generating the lookup table corresponding to a desired target output level using the measurement data tables 41 and 42 illustrated in FIG. 6. In FIG. 7, a black circle indicates measurement data stored in the measurement data tables 41 and 42 illustrated in FIG. 6. The measurement data is expressed as a pair consisting of an input PD value and a drive voltage value. The input PD value indicates the optical input power detected by the photodetector 14. The drive voltage value indicates the drive voltage to be applied to the semiconductor optical amplifier 13. Measurement data e1 to e8 indicate a correspondence relationship between the input PD value and the drive voltage value for obtaining "the output level=10 dBm". Measurement data f1 to f8 indicate a correspondence relationship between the input PD value and the drive voltage value for obtaining "the output level=−10 dBm". Note that the measurement data e1 to e8 and measurement data f1 to f8 are stored in the measurement data tables 41 and 42 illustrated in FIG. 6.

In order to generate a lookup table corresponding to the desired target output level, linear interpolation in an input PD value direction is performed for each of the output levels first. That is, for the measurement data items e1 to e8 obtained for "the output level=10 dBm", linear interpolation is performed between any two neighboring measurement data items. For example, by performing linear interpolation for the measurement data items e3 and e4, interpolation data between the measurement data items e3 and e4 can be computed. At that time, a plurality of interpolation data items between the measurement data items e3 and e4 are computed. For example, in order to obtain, from the measurement data table 41 illustrated in FIG. 6, a table having an increment of the input PD value that is the same as that of the lookup table 100a illustrated in FIG. 4, 99 interpolation data items are computed between the measurement data items e3 and e4.

Through such linear interpolation, a relationship between the input PD value and the drive voltage value can be obtained with a sufficiently small increment of the optical input power for "the output level=10 dBm". By performing similar computation, a correspondence relationship between the input PD value and the drive voltage value can be further obtained with a sufficiently small increment of the optical input power for "the output level=−10 dBm".

Subsequently, linear interpolation in a drive voltage direction is performed. For example, by performing linear interpolation on the basis of the measurement data items e4 and f4, an interpolation data item d4 can be computed. The internal ratio used in the interpolation calculation is determined on the basis of the target output level. For example, when "the target output level=9 dBm" is given, the drive voltage value indicated by the interpolation data item d4 can be computed by dividing the drive voltage value indicated by the measurement data items e4 and f4 internally in the ratio 1:19. Similarly, when "the target output level=8 dBm" is given, the drive voltage value indicated by the interpolation data item d4 can be computed by dividing the drive voltage value indicated by the measurement data items e4 and f4 internally in the ratio 2:18.

By performing linear interpolation in the drive voltage direction on all of the input PD values, an input PD value-drive voltage value curved line D used for obtaining the target output level can be generated. Since the curved line D defines a relationship between the input PD value and the drive voltage value for obtaining a certain output level (i.e., the target output level), the curved line D is sometimes referred to as a "fixed output level curved line". That is, the curved line D illustrated in FIG. 7 is a fixed output level curved line corresponding to the target output level. The lookup table corresponding to the target output level is generated by storing the interpolation data items defining the curved line D in a memory area in a predetermined format. Note that a method for expanding the lookup table through interpolation is described in, for example, Japanese Laid-open Patent Publication No. 2012-70353.

As described above, by performing interpolation on the measurement data (e1 to e8 and f1 to f8 in FIG. 7) and generating a lookup table corresponding to the target output level, the number of measurement operations can be considerably reduced from that in the configuration illustrated in FIG. 4. Accordingly, a time for measuring data to be stored in the lookup table can be reduced and, therefore, the cost for generating the lookup table can be reduced.

Unfortunately, depending on, for example, the rated specification of an element used in the optical output level control apparatus 10, it is difficult to perform the above-described interpolation in all the areas. Such an issue is described next with reference to FIG. 8.

The gain of the semiconductor optical amplifier 13 is controlled by the drive voltage applied from the drive circuit 21. At that time, the semiconductor optical amplifier 13 has the maximum rating of the drive voltage. That is, it is difficult for the optical output level control apparatus 10 to control the drive voltage of the semiconductor optical amplifier 13 to a value higher than the maximum rating.

Figure 8:
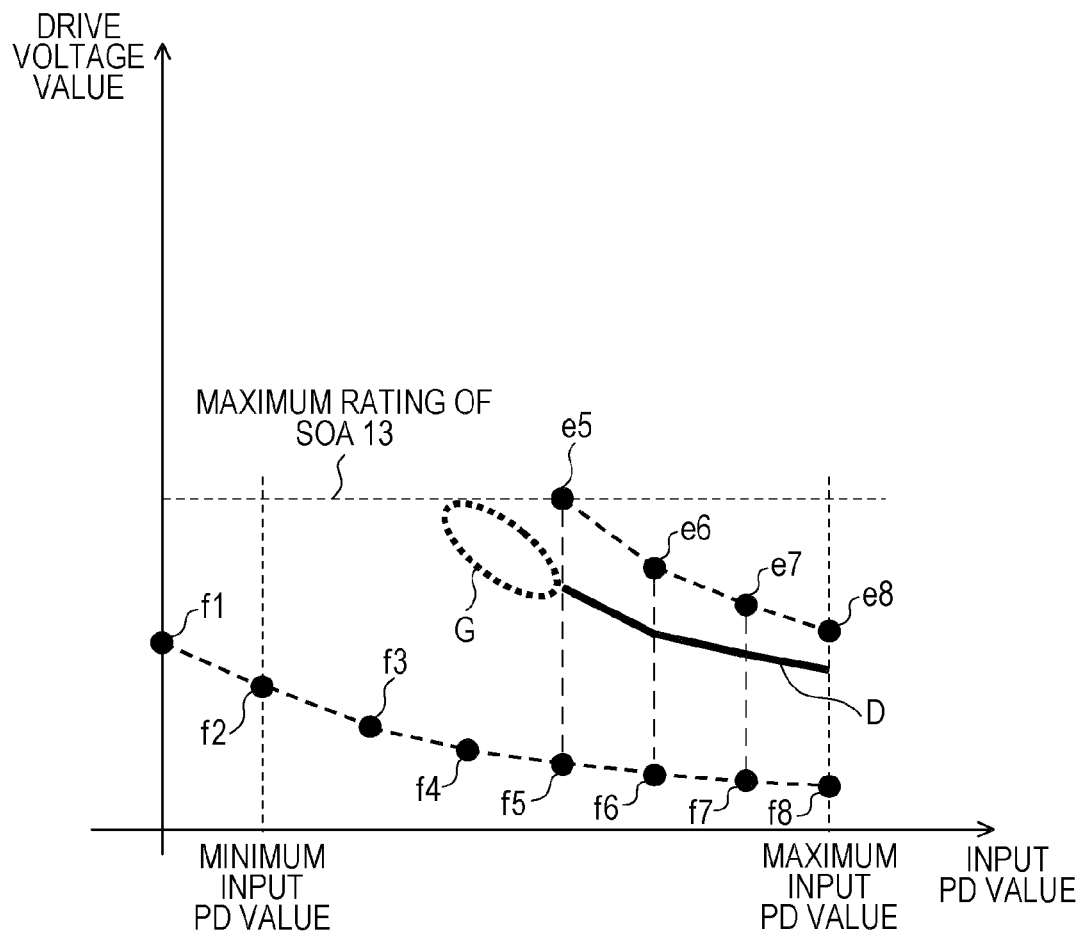
FIG. 8 illustrates an area in which linear interpolation is unavailable.

In an example illustrated in FIG. 8, among the measurement data e1 to e8 and f1 to f8 illustrated in FIG. 7, the drive voltage values for the measurement data e1 to e4 exceed the maximum rating of the drive voltage of the semiconductor optical amplifier 13. Accordingly, in such a case, it is difficult for the measuring system to obtain the measurement data e1 to e4 illustrated in FIG. 7.

At that time, the fixed output level curved line corresponding to the target output level (the curved line D in FIG. 8) can be computed from measurement data for "output level=10 dBm" and measurement data for "output level=−10 dBm" through linear interpolation. Unfortunately, in the example illustrated in FIG. 8, the measurement data e1 to e4 are not obtained. Accordingly, in an area where the input PD value is lower than the measurement data e5, it is difficult to generate the fixed output level curved line corresponding to the target output level through linear interpolation. That is, in an area where the drive voltage value is lower than or equal to the maximum rating of the semiconductor optical amplifier 13 and the input PD value is lower than the measurement data e5 (i.e., an area G in FIG. 8), it is difficult to generate the fixed output level curved line corresponding to the target output level through linear interpolation. Note that in an area where the drive voltage value is higher than the maximum rating of the semiconductor optical amplifier 13, generation of the fixed output level curved line corresponding to the target output level is unnecessary.

In the case illustrated in FIG. 8, in an area where the input PD value is lower than the measurement data e5, a pseudo fixed output level curved line corresponding to the target output level can be generated. For example, a pseudo fixed output level curved line can be generated through linear interpolation using the maximum rating value of the semiconductor optical amplifier 13 and the measurement data for "output level=−10 dBm" through interpolation. However, the pseudo fixed output level curved line generated in this manner contains a large error, as compared with a regular fixed output level curved line. Therefore, if control of the output level is performed on the basis of such a pseudo fixed output level curved line, the optical output level of the optical output level control apparatus 10 becomes unstable.

In addition, the photodetector 14 has an area where the optical input power can be properly detected. For example, if the optical input power is very low, the detection accuracy of the photodetector 14 decreases due to, for example, noise. Furthermore, if the optical input power is very high, it is difficult for the photodetector 14 to accurately detect the optical power. Hereinafter, the input PD value corresponding to minimum optical power that the photodetector 14 can detect is sometimes referred to as a "minimum input PD value". In addition, the input PD value corresponding to maximum optical power that the photodetector 14 can detect (or the maximum rating) is sometimes referred to as a "maximum input PD value".

In the example illustrated in FIG. 8, the input PD value of the measurement data f2 corresponds to the minimum input PD value, and each of the input PD values of the measurement data e8 and f8 corresponds to the maximum input PD value. Due to the reasons described above, in an area where the input PD value indicating the optical input power is lower than the minimum input PD value and an area where the input PD value indicating the optical input power is higher than the maximum input PD value, measurement of a correspondence relationship between the input PD value and the drive voltage value is not performed. Accordingly, in the example illustrated in FIG. 8, measurement of the measurement data f1 is not performed.

As described above, in the background of the technology, if it is attempted to reduce the number of measurement operations for generating the lookup table, there is a risk of the optical output level of the optical output level control apparatus 10 being unstable. However, according to the configuration and technique of the present exemplary embodiment, such an issue can be addressed or resolved.

Configuration and Technique of Embodiment

As described above, according to the present exemplary embodiment, the optical output level control apparatus 10 is disposed and used on the output side of the multiplexer (MUX) 2 of the optical transmission apparatus 1 illustrated in FIG. 1, for example. In addition, as illustrated in FIG. 2, the optical output level control apparatus 10 includes the optical coupler 11, the delay line 12, the semiconductor optical amplifier (SOA) 13, the photodetector (PD) 14, the A/D converter 15, the measurement data storage unit 16, the table generator 17, the lookup table 18, the searcher 19, the D/A converter 20, and the drive circuit 21.

The measurement data storage unit 16 stores data that define the first curved line and the second curved line. The first curved line indicates the relationship between the input PD value and the drive voltage for obtaining a first optical output level. The second curved line indicates the relationship between the input PD value and the drive voltage for obtaining a second optical output level.

According to the present exemplary embodiment, the first curved line is a fixed output level curved line representing the relationship between the input PD value and the drive voltage value for obtaining "the output level=10 dBm". In addition, the second curved line is a fixed output level curved line representing the relationship between the input PD value and the drive voltage value for obtaining "the output level=−10 dBm". Note that the measurement data storage unit 16 further stores measurement data defining the end points of each of a plurality of fixed output level curved lines.

Figure 9:
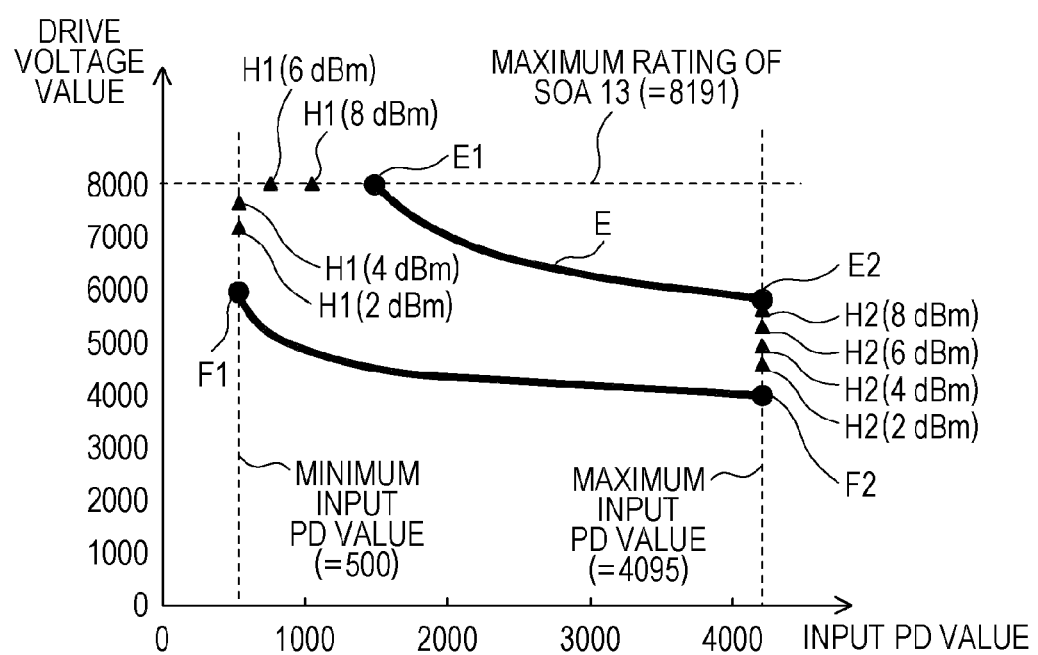
FIG. 9 illustrates measurement data stored in a measurement data storage unit.

FIG. 9 illustrates the measurement data stored in the measurement data storage unit 16. The abscissa represents the input PD value detected by the photodetector 14. Note that the input PD value is digital data indicating the optical input power. The ordinate represents a drive voltage value for controlling the gain of the semiconductor optical amplifier 13. As used herein, the term "drive voltage value" refers to control data used to specify a voltage to be applied to the semiconductor optical amplifier 13. Hereinafter, the coordinate system in which the abscissa and ordinate represent the input PD value and the drive voltage value, respectively, is also referred to as an "input PD value-drive voltage value coordinate system".

Note that according to the present exemplary embodiment, the drive voltage value equivalent to the maximum rating of the drive voltage of the semiconductor optical amplifier 13 is "8191". In addition, the minimum input PD value and the maximum input PD value defining the range of detection performed by the photodetector 14 are "500" and "4095", respectively. That is, according to the present exemplary embodiment, the optical output level control apparatus 10 operates within the following range: the drive voltage value≤8191, and 500≤the input PD value≤4095. Accordingly, hereinafter, in the input PD value-drive voltage value coordinate system, each of a straight line indicating "the drive voltage value=8191", a straight line indicating "the input PD value=500", and a straight line indicating "the input PD value=4095" is sometimes referred to as an "edge".

A fixed output level curved line E illustrated in FIG. 9 defines the correspondence relationship between the input PD value and the drive voltage value for obtaining "the output level=10 dBm". Points E1 and E2 are the end points of the fixed output level curved line E. The fixed output level curved line E can be obtained by sweeping the input PD value in the measuring system illustrated in FIG. 5, detecting a pair consisting of the input PD value and the drive voltage value that provides "the output level=10 dBm", and plotting a point representing each of the pairs in the input PD value-drive voltage value coordinate system illustrated in FIG. 9. Note that the fixed output level curved line E corresponds to the above-described first curved line.

FIG. 10A illustrates an example of the measurement data corresponding to the fixed output level curved line E. In this example, the drive voltage values corresponding to the input PD values=1500, 2000, 2500, . . . are measured and stored. Note that in an area where the input PD value is lower than 1500, the drive voltage value exceeds the maximum rating of the semiconductor optical amplifier 13. Accordingly, measurement is not performed.

A fixed output level curved line F illustrated in FIG. 9 defines the correspondence relationship between the input PD value and the drive voltage value for obtaining "the output level=−10 dBm". Points F1 and F2 are the end points of the fixed output level curved line F. The fixed output level curved line F can be obtained by sweeping the input PD value in the measuring system illustrated in FIG. 5, detecting a pair consisting of the input PD value and the drive voltage value that provides "the output level=−10 dBm", and plotting a point representing each of the pairs in the input PD value-drive voltage value coordinate system illustrated in FIG. 9. Note that the fixed output level curved line F corresponds to the above-described second curved line.

FIG. 10B illustrates an example of the measurement data corresponding to the fixed output level curved line F. In this example, the drive voltage values corresponding to the input PD values=500, 1000, 1500, . . . are measured and stored.

End points H1 (8 dBm) and H2 (8 dBm) illustrated in FIG. 9 are intersection points of the fixed output level curved line indicating a pair consisting of the input PD value and the drive voltage value for obtaining "the output level=8 dBm" and the edges. That is, the end point H1 (8 dBm) is an intersection point of the fixed output level curved line corresponding to "the output level=8 dBm" and the edge indicating "the drive voltage value=8191". The end point H2 (8 dBm) is an intersection point of the fixed output level curved line corresponding to "output level=8 dBm" and the edge indicating "the input PD value=4059".

End points H1 (6 dBm) and H2 (6 dBm) are intersection points of the fixed output level curved line indicating a pair consisting of the input PD value and the drive voltage value for obtaining "the output level=6 dBm" and the edges. That is, the end point H1 (6 dBm) is an intersection point of the fixed output level curved line corresponding to "the output level=6 dBm" and the edge indicating "the drive voltage value=8191". The end point H2 (6 dBm) is an intersection point of the fixed output level curved line corresponding to "the output level=6 dBm" and the edge indicating "the input PD value=4059".

End points H1 (4 dBm) and H2 (4 dBm) are intersection points of the fixed output level curved line indicating a pair consisting of the input PD value and the drive voltage value for obtaining "the output level=4 dBm" and the edges. That is, the end point H1 (4 dBm) is an intersection point of the fixed output level curved line corresponding to "the output level=4 dBm" and the edge indicating "the input PD value=500". The end point H2 (4 dBm) is an intersection point of the fixed output level curved line corresponding to "output level=4 dBm" and the edge indicating "the input PD value=4059".

Similarly, end points H1 and H2 which are intersection points of fixed output level curved lines for obtaining a plurality of output levels between 10 dBm and −10 dBm are detected. At that time, the optical output level control apparatus 10 operates within an area surrounded by the "edges". Accordingly, the fixed output level curved line is practically formed within the area surrounded by the "edges". Thus, the intersection point of the fixed output level curved line and the "edge" is the end point of the fixed output level curved line.

Note that data that define the end points are measured in the measuring system illustrated in FIG. 5. For example, the end points H1 (8 dBm) and H1 (6 dBm) illustrated in FIG. 9 can be obtained by measuring the input PD values that provide the optical output levels of "8 dBm" and "6 dBm", respectively, while maintaining a drive voltage value of 8191. In addition, the end points H1 (4 dBm) and H1 (2 dBm) can be obtained by measuring the input PD values that provide optical output levels of "4 dBm" and "2 dBm", respectively, while maintaining a drive voltage value of 500. Furthermore, the end points H2 (8 dBm) and H2 (6 dBm) can be obtained by measuring the drive voltage values that provide optical output levels of "8 dBm" and "6 dBm", respectively, while maintaining the input PD value at 4095.

FIG. 11 illustrates an example of measurement data defining the end points of the fixed output level curved lines. The measurement data are also stored in the measurement data storage unit 16. As described above, the measurement data of the end points are measured in the measuring system illustrated in FIG. 5. According to the present exemplary embodiment, the "coordinates of upper left end point" indicates the measurement data on the edge indicating "the drive voltage value=8191" or "the input PD value=500". According to the present exemplary embodiment, the "coordinates of lower right end point" indicates the measurement data on the edge indicating "the input PD value=4095". Note that in the example illustrated in FIG. 11, the measurement data of the end points of the fixed output level curved lines E and F are also stored.

A method for generating the lookup table 18 corresponding to a target output level on the basis of the measurement data stored in the measurement data storage unit 16 is described next. The lookup table 18 is generated by the table generator 17. At that time, the table generator 17 generates the lookup table 18 by performing the following processes:

(1) normalization,
(2) interpolation, and
(3) generation of a target curved line.

These processes are described below.

(1) Normalization

Figure 12:
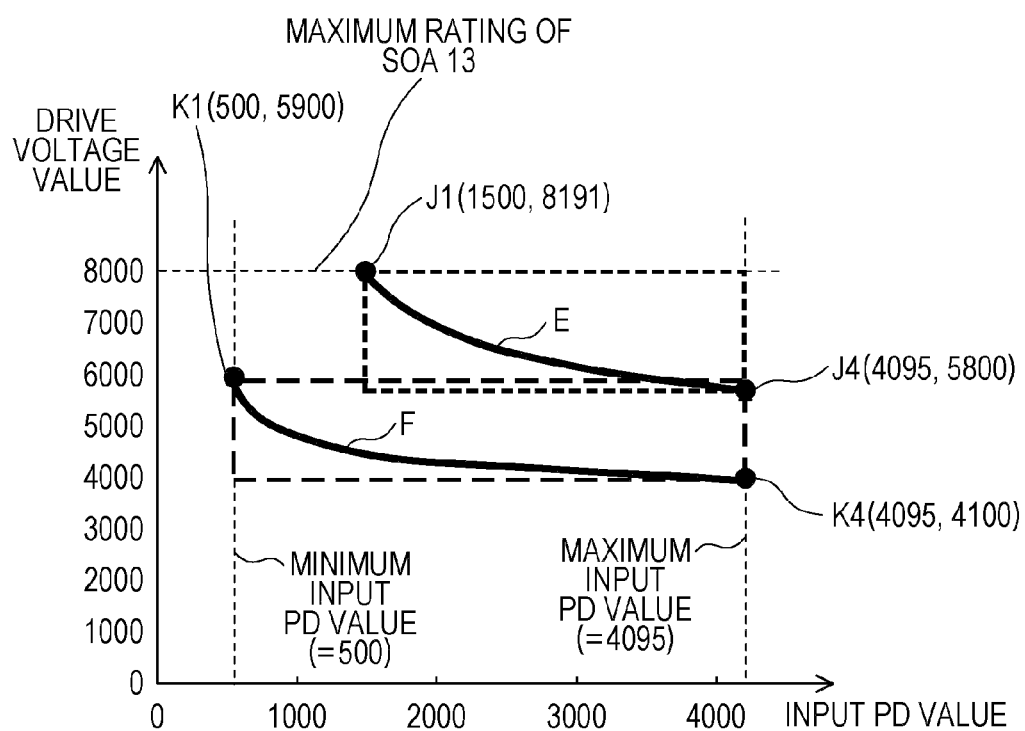
FIG. 12 illustrates an example of the fixed output level curved line.

The table generator 17 normalizes the fixed output level curved lines E and F. Normalization is performed by the normalizer 17a illustrated in FIG. 2. According to the present exemplary embodiment, as illustrated in FIGS. 11 and 12, the coordinates of one of the end points J1 of the fixed output level curved line E are (1500, 8191), and the coordinates of the other end point J4 are (4095, 5800). In addition, the coordinates of one of the end points K1 of the fixed output level curved line F are (500, 5900), and the coordinates of the other end point K4 are (4095, 4100). Note that in FIG. 12, the fixed output level curved lines E and F are illustrated in the input PD value-drive voltage value coordinate system.

Normalization of the fixed output level curved lines E and F are performed by correcting at least one of the fixed output level curved lines E and F so that the ranges of the input PD values of the fixed output level curved lines E and F are the same and the ranges of the drive voltage values of the fixed output level curved lines E and F are the same.

Figure 13A:
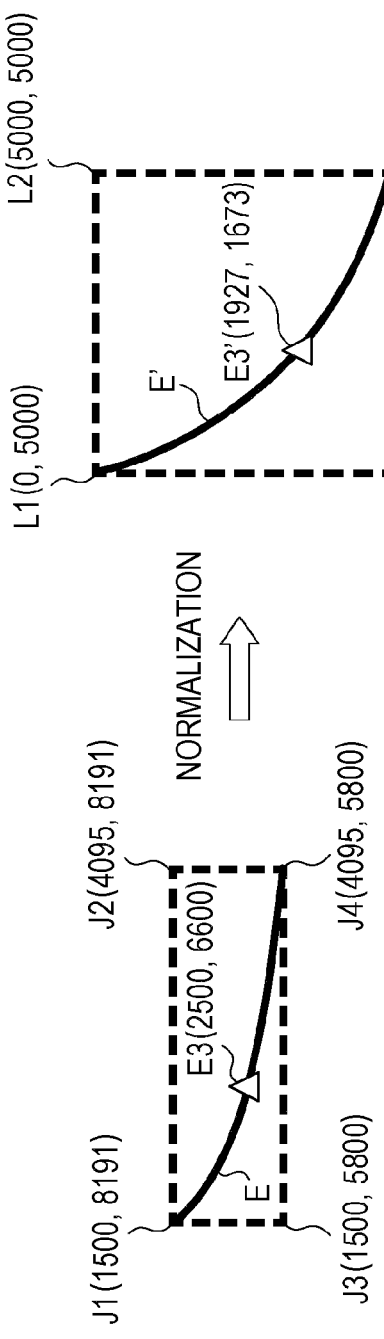
FIGS. 13A and 13B illustrate normalization of the fixed output level curved line.
Figure 13B:
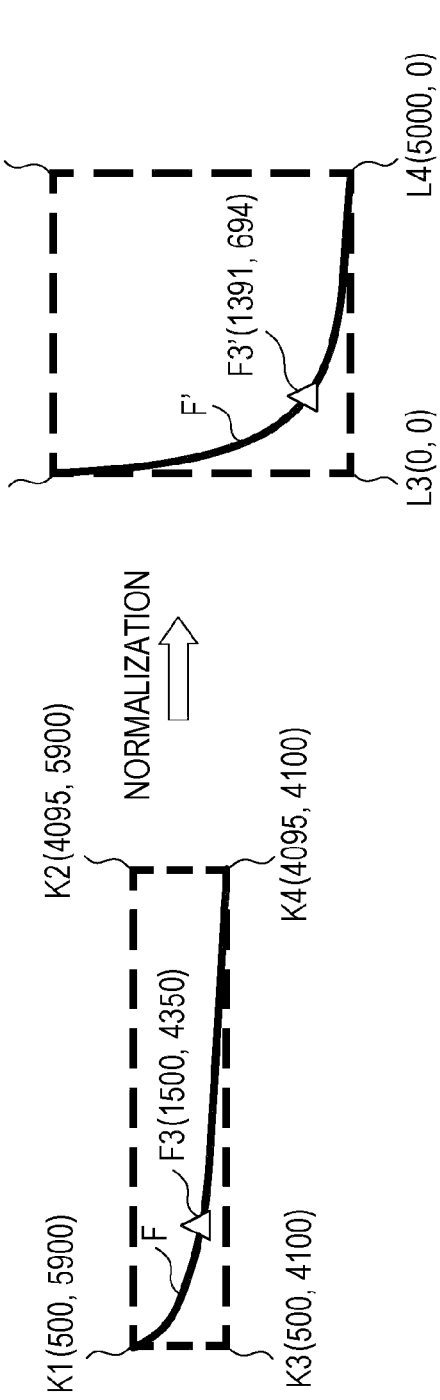

FIGS. 13A and 13B illustrate normalization of the fixed output level curved line. According to the present exemplary embodiment, both the fixed output level curved lines E and F are corrected. A rectangle J1-J2-J3-J4 illustrated in FIG. 13A is defined by the two end points J1 and J4 of the fixed output level curved line E. Herein, the coordinates of the end points J1 and J4 are (1500, 8191) and (4095, 5800), respectively. Accordingly, the end points J1 to J4 have the coordinates illustrated in FIG. 13A.

A rectangle K1-K2-K3-K4 illustrated in FIG. 13B is defined by the two end points K1 and K4 of the fixed output level curved line F. Herein, the coordinates of the end points K1 and K4 are (500, 5900) and (4095, 4100), respectively. Accordingly, the end points K1 to K4 have the coordinates illustrated in FIG. 13B.

The table generator 17 corrects the fixed output level curved line E so that the rectangle J1-J2-J3-J4 can be mapped into a common rectangle L1-L2-L3-L4. In addition, the table generator 17 corrects the fixed output level curved line F so that the rectangle K1-K2-K3-K4 can be mapped into the common rectangle L1-L2-L3-L4. The coordinates of the vertexes of the common rectangle L1-L2-L3-L4 are (0, 5000), (5000, 5000), (0, 0), and (5000, 0). While the present exemplary embodiment has been described with reference to the common rectangle L1-L2-L3-L4 being a square in FIGS. 13A and 13B, the common rectangle L1-L2-L3-L4 is not limited to a square in shape.

The mapping from the rectangle having the end points J1 to J4 to the common rectangle L1-L2-L3-L4 is performed through parallel translation and a scalar operation. That is, the rectangle J1-J2-J3-J4 (i.e., the fixed output level curved line E) is parallel translated so that the end point J3 moves to the end point L3. Thereafter, a scalar operation is performed on the rectangle J1-J2-J3-J4 so that the length between the end points J3 and J4 is the same as the length between the end points L3 and L4 in the input PD value direction. Furthermore, a scalar operation is performed on the rectangle J1-J2-J3-J4 so that the length between the end points J1 and J3 is the same as the length between the end points L1 and L3 in the drive voltage value direction.

As an example, computation for a measurement point E3 (2500, 6600) that constitutes the fixed output level curved line E is described. Note that the X coordinate and Y coordinate of the measurement point represent the input PD value and the drive voltage value, respectively.

The measurement point E3 is parallel translated. At that time, the coordinates of the end point J3 is (1500, 5800), and the coordinates of the end point L3 is (0, 0). Accordingly, the measurement point E3 is moved to a point M through the following parallel translation: M=(2500, 6600)−(1500, 5800) =(1000, 800).

Subsequently, the following scalar operation in the input PD value direction is performed on the X coordinate of the point M. In addition, the following scalar operation in the drive voltage value direction is performed on the Y coordinate of the point M. As a result, the measurement point E3 is mapped to a point E3'. The X coordinate of the point E3'=1000×{5000/(4095−1500)}=1927. The Y coordinate of the point E3'=800×{5000/(8191−5800)}=1673.

Through the above-described arithmetic operation, the measurement point E3 that constitutes the fixed output level curved line E is mapped to the point E3' illustrated in FIG. 13A. Accordingly, by performing the same arithmetic operation on all of the measurement points that constitute the fixed output level curved line E, a curved line E' illustrated in FIG. 13A can be obtained. Note that hereinafter, the curved line E' obtained by performing the above-described mapping operation on the fixed output level curved line E is also referred to as a normalized curved line E'.

Mapping from the rectangle K1-K2-K3-K4 to the common rectangle L1-L2-L3-L4 is substantially the same as the mapping from the rectangle J1-J2-J3-J4 to the common rectangle L1-L2-L3-L4. As an example, computation for a measurement point F3 (1500, 4350) that constitutes the fixed output level curved line F is described below.

The coordinates of the end point K3 is (500, 4100). Accordingly, the measurement point F3 is moved to a point N through the following parallel translation: N=(1500, 4350)− (500, 4100)=(1000, 250).

Subsequently, the following scalar operation in the input PD value direction and the drive voltage value direction is performed on the coordinates of the point N. As a result, the measurement point F3 is mapped to a point F3'. The X coordinate of the point F3'=1000×{5000/(4095−500)}=1391. The Y coordinate of the point F3'=250×{5000/(5900−4100) }=694.

Through the above-described arithmetic operation, the measurement point F3 that constitutes the fixed output level curved line F is mapped to the point F3' illustrated in FIG. 13B. Accordingly, by performing the same arithmetic operation on all of the measurement points that constitute the fixed output level curved line F, a curved line F' illustrated in FIG. 13B can be obtained. Note that hereinafter, the curved line F' obtained by performing the above-described mapping operation on the fixed output level curved line F is also referred to as a normalized curved line F'.

In this manner, the table generator 17 normalizes the fixed output level curved lines E and F so that the range of the input PD value of the fixed output level curved line E is the same as that of the fixed output level curved line F and the range of the drive voltage value of the fixed output level curved line E is the same as that of the fixed output level curved line F. As a result, the fixed output level curved line E' and the fixed output level curved line F' are generated.

While the present exemplary embodiment has been described with reference to the corrected fixed output level curved lines E and F, the present disclosure is not limited thereto. That is, the table generator 17 may correct only one of the fixed output level curved lines E and F. In such a case, the table generator 17 corrects the fixed output level curved line E so that the rectangle J1-J2-J3-J4 is mapped to the rectangle K1-K2-K3-K4. Alternatively, the table generator 17 may correct the fixed output level curved line F so that the rectangle K1-K2-K3-K4 is mapped to the rectangle having J1-J2-J3-J4.

(2) Interpolation

The table generator 17 generates an interpolation curved line corresponding to the target output level through interpolation based on the fixed output level curved lines E' and F' (i.e., the normalized fixed output level curved lines E and F). The interpolation operation is performed by the interpolator 17b illustrated in FIG. 2. The target output level is specified by, for example, the user.

FIG. 14 illustrates the interpolation operation. As illustrated in FIG. 14, the interpolation operation is performed in the Y direction (i.e., the drive voltage value direction). For example, by performing the linear interpolation on measurement data E4' and F4', the coordinates of measurement data D4' can be obtained. At that time, the X coordinates of the measurement data E4', F4', and D4' are all the same. In addition, the internal ratio used in the interpolation operation is determined on the basis of the output levels of the fixed output level curved lines E and F and the target output level. According to the present exemplary embodiment, the output levels of the fixed output level curved lines E and F are "10 dBm" and "−10 dBm", respectively. Accordingly, if, for example, "the target output level=9 dBm" is given, the Y coordinate of the measurement data D4' can be obtained by dividing the Y coordinates of the measurement data E4'-F4' internally in the ratio 1:19. If, "the target output level=7 dBm" is given, the Y coordinate of the measurement data D4' can be obtained by dividing the Y coordinates of the measurement data E4'-F4' internally in the ratio 3:17.

The above-described interpolation operation is performed over the range of the normalized input PD value (i.e., from 0 to 5000). As a result, an interpolation curved line corresponding to the target output level is generated. In the example illustrated in FIG. 14, an interpolation curved line D' is generated.

Note that it is desirable that the table generator 17 increase the number of points that constitute each of the normalized curved lines E' and F' through linear interpolation in the input PD value direction before interpolation operation for generating the interpolation curved lines is performed. In this case, it is also desirable that the X coordinates of the points that constitute the normalized curved line E' be the same as those that constitute the normalized curved line F'.

(3) Generation of Target Curved Line

The table generator 17 generates a target curved line corresponding to the target output level by denormalizing the interpolation curved line D' obtained by performing interpolation based on the normalized curved lines E' and F'. Note that the denormalization is performed by the target curved line generator 17c illustrated in FIG. 2. In addition, the denormalization is realized by performing inverse mapping corresponding to the mapping illustrated in FIGS. 13A and 13B.

Figure 15:
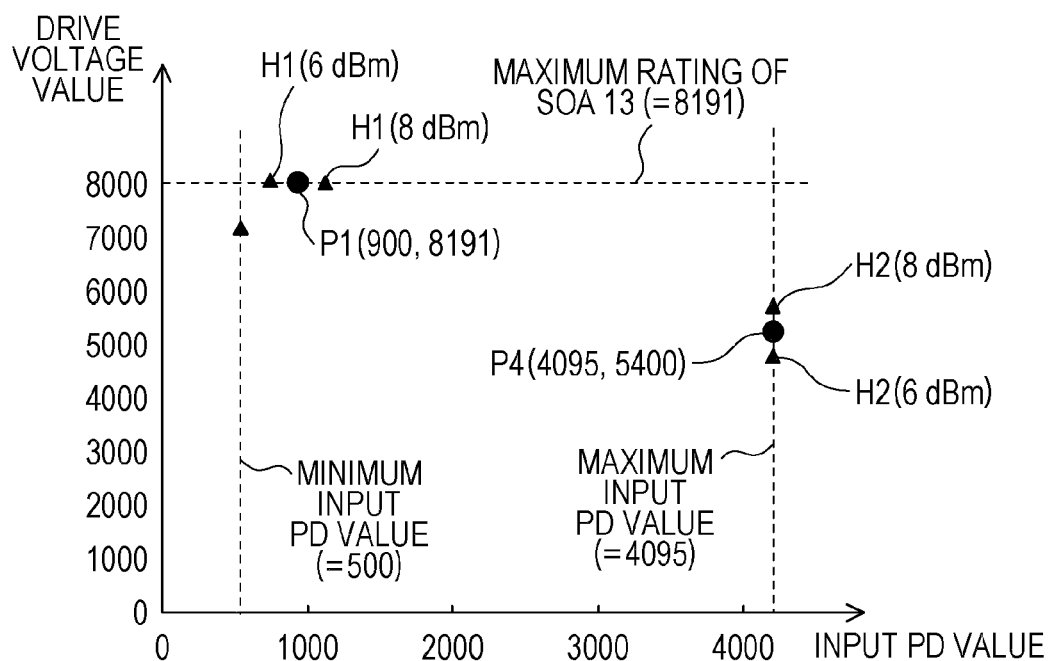
FIG. 15 illustrates a method for identifying an end point of a target curved line.

A process for generating the target curved line corresponding to the target output level by denormalizing the interpolation curved line D' is described below with reference to FIGS. 15 and 16. In this case, the specified target output level is 7 dBm.

Figure 16:
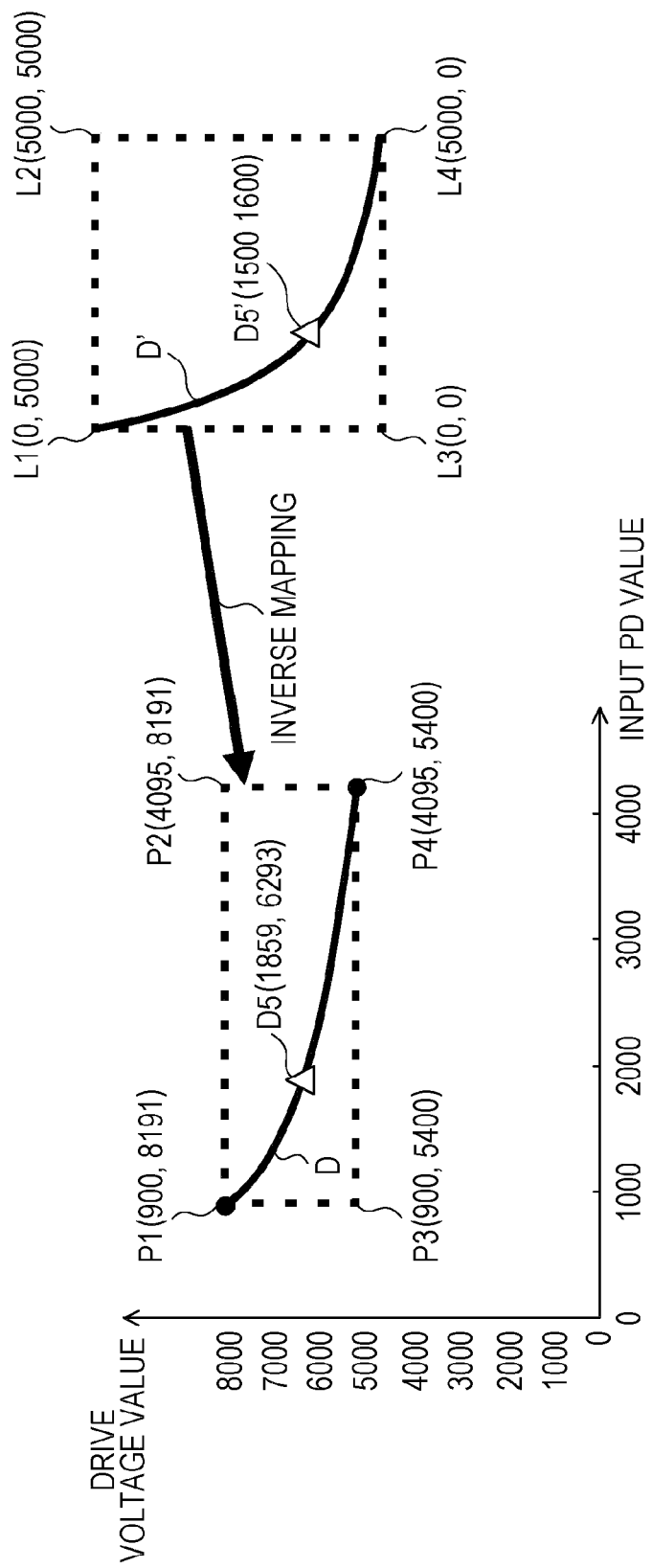
FIG. 16 illustrates a method for generating the target curved line through denormalization.

The table generator 17 performs inverse mapping on the two end points of the interpolation curved line D' illustrated in FIG. 16 first. At that time, the table generator 17 computes the coordinates of the end points of the fixed output level curved line corresponding to "the output level=7 dBm" using the measurement data illustrated in FIG. 11 (or FIG. 9).

When generating the fixed output level curved line corresponding to "the output level=7 dBm", the table generator 17 refers to a set of the measurement data for the output level close to "the output level=7 dBm". At that time, the measurement data corresponding to an output level that is higher than 7 dBm and the measurement data corresponding to an output level that is lower than 7 dBm are referred to. For example, if the measurement data illustrated in FIG. 11 is used, the measurement data corresponding to "the output level=8 dBm" and "the output level=6 dBm" are referred to.

In the upper left region of the input PD value-drive voltage value coordinates, the coordinates of the end point H1 (8 dBm) corresponding to "the output level=8 dBm" is (1100, 8191), and the coordinates of the end point H1 (6 dBm) corresponding to "the output level=6 dBm" is (700, 8191). Accordingly, by performing linear interpolation based on the two coordinates, the coordinates (900, 8191) of the end point P1, which is one of the end points of the fixed output level curved line corresponding to "the output level=7 dBm" can be obtained, as illustrated in FIG. 15.

In the lower right region of the input PD value-drive voltage value coordinates, the coordinates of the end point H2 (8 dBm) corresponding to "the output level=8 dBm" is (4095, 5600), and the coordinates of the end point H2 (6 dBm) corresponding to "the output level=6 dBm" is (4095, 5200). Accordingly, by performing linear interpolation based on the two coordinates, the coordinates (4095, 5400) of the end point P4, which is the other end point of the fixed output level curved line corresponding to "the output level=7 dBm", can be obtained, as illustrated in FIG. 15.

Subsequently, as illustrated in FIG. 16, the table generator 17 corrects the interpolation curved line D' so that the common rectangle L1-L2-L3-L4 is inverse mapped to the rectangle P1-P2-P3-P4. Herein, the rectangle P1-P2-P3-P4 is defined by the two end points P1 and P4 of the fixed output level curved line corresponding to "the output level=7 dBm". That is, the rectangle P1-P2-P3-P4 has the vertexes thereof at the coordinates illustrated in FIG. 16.

Inverse mapping from the common rectangle L1-L2-L3-L4 to the rectangle having the end points P1-P2-P3-P4 is achieved through a scalar operation and parallel translation. That is, a scalar operation is performed on the common rectangle L1-L2-L3-L4 (i.e., the interpolation curved line D') so that the length between the end points L3 and L4 is the same as the length between the end points P3 and P4 in the input PD value direction. In addition, a scalar operation is performed on the common rectangle L1-L2-L3-L4 so that the length between the end points L1 and L3 is the same as the length between the end points P1 and P3 in the drive voltage value direction. Furthermore, parallel translation is performed on the common rectangle L1-L2-L3-L4 so that the end point L3 moves to the end point P3. As an example, computation performed on a data point D5' (1500, 1600) on the interpolation curved line D' is described below.

The table generator 17 performs the following scalar operation on the X coordinate and Y coordinate of the data point D5' first. As a result, the data point D5' is mapped to the following coordinates: X coordinate=1500×{(4095−900)/5000}=959, and Y coordinate=1600×{(8191−5400)/5000}=893.

Subsequently, the table generator 17 performs the following parallel translation. The coordinates of the end point P3 is (900, 5400). As a result, as illustrated in FIG. 16, the data point D5' is inverse mapped to a data point D5. D5=(959, 893)+(900, 5400)=(1859, 6293).

The table generator 17 performs the above-described operation on each of data points that constitute the interpolation curved line D'. In this manner, the fixed output level curved line (the target curved line) D corresponding to the target output level is generated. Thereafter, the table generator 17 stores the generated data defining the fixed output level curved line D (i.e., pairs of an input PD value and a drive voltage value) in the lookup table 18.

In this manner, in the optical output level control apparatus 10 according to the present exemplary embodiment, the table generator 17 generates the lookup table 18 corresponding to the target output level. The searcher 19 refers to the lookup table 18 and outputs the drive voltage value corresponding to the input PD value indicating the optical input power. Thereafter, the drive circuit 21 controls the gain of the semiconductor optical amplifier 13 using the drive voltage corresponding to the drive voltage value searched for by the searcher 19. Accordingly, even when the optical input power varies, the power of the optical signal output from the semiconductor optical amplifier 13 can be controlled to the target output level.

As described above, the table generator 17 normalizes the fixed output level curved lines E and F. Through such normalization, the normalized curved lines E' and F' illustrated in FIGS. 13A and 13B and FIG. 14 are generated. At that time, the coordinates of the end point of the normalized curved line E' is the same as those of the normalized curved line F'. In addition, the shapes of the normalized curved lines E' and F' are similar to each other. Accordingly, when the target output level is given, the interpolation curved line D' obtained through interpolation based on the normalized curved lines E' and F' accurately indicates the fixed output level curved line corresponding to the target output level. Therefore, by generating a lookup table corresponding to the target output level on the basis of the interpolation curved line D', the optical output level control apparatus 10 can accurately control the power of the output optical signal to the target level.

In addition, if a desired fixed output level curved line is generated from the measurement data for two output levels through interpolation without performing the normalization according to the present exemplary embodiment, an error in the generated fixed output level curved line may be increased. For example, if the difference between the two output levels is large (20 dB in the example illustrated in FIGS. 6 and 7), an error in the generated fixed output level curved line is large. In contrast, according to the technique of the present exemplary embodiment, a fixed output level curved line corresponding to the target output level is generated from two normalized fixed output level curved lines through interpolation. At that time, the shapes of the two normalized fixed output level curved lines are similar to each other. Accordingly, an error in the generated fixed output level curved line can be small. That is, according to the present exemplary embodiment, a more accurate lookup table can be generated from a small number of measurement data items. As a result, an amount of work for collecting the measurement data used to generate a lookup table corresponding to the target output level can be reduced.

Other Exemplary Embodiments

In the configuration illustrated in FIG. 2, the optical output level control apparatus 10 includes the measurement data storage unit 16 and the table generator 17. However, the present disclosure is not limited to such a configuration. For example, the measurement data storage unit 16 may be removed from the optical output level control apparatus 10. In such a case, the measurement data illustrated in FIGS. 10A and 10E3 and FIG. 11 is provided to the optical output level control apparatus 10. Thereafter, the table generator 17 generates the lookup table 18 corresponding to the target output level on the basis of the measurement data provided from the outside of the optical output level control apparatus 10. Alternatively, the measurement data storage unit 16 and the table generator 17 may be removed from the optical output level control apparatus 10. In such a case, the lookup table 18 generated outside the optical output level control apparatus 10 is set in the optical output level control apparatus 10.

In the above-described exemplary embodiments, the measurement data storage unit 16 stores data defining the fixed output level curved lines corresponding to two output levels. However, the present disclosure is not limited to such a configuration. That is, the measurement data storage unit 16 may store data defining fixed output level curved lines corresponding to three output levels. In such a case, the table generator 17 can generate the lookup table 18 on the basis of two of the fixed output level curved lines for two output levels that are close to the target output level.

Note that if an optical amplifier is disposed on the input side of the optical output level control apparatus 10, ASE is inevitably added to an optical signal input to the optical output level control apparatus 10. However, even in such a case, by disposing the ASE cut filter 35 between the optical amplifier and the input side of the optical coupler 11 illustrated in FIG. 2 or between the output side of the optical coupler 11 and the photodetector (PD) 14, the photodetector (PD) 14 can receive only the input optical signal. Thus, the A/D converter 15 can read only the power of the input optical signal. Accordingly, the optical output level control apparatus 10 can maintain the optical output level at a certain level. According to the present exemplary embodiment, even when the optical output level control apparatus 10 is disposed on the output side of the optical amplifier 3 of the optical transmission apparatus 1 illustrated in FIG. 1, the optical output level control apparatus 10 can maintain the optical output level at a certain level. In such a case, the optical output level control apparatus 10 is not limited to being inside of the optical transmission apparatus 1. Instead, the optical output level control apparatus 10 can be disposed at any position between the optical amplifier 3 and an optical receiver.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical output level control apparatus, comprising:
    a detector configured to detect optical power of an input optical signal;
    an optical amplifier configured to amplify the input optical signal;
    a memory configured to store data that define a first curved line representing a relationship between the optical input power and a drive voltage of the optical amplifier for obtaining a first output level and data that defines a second curved line representing a relationship between the optical input power and the drive voltage of the optical amplifier for obtaining a second output level;
    a generator configured to correct at least one of the first and second curved lines so that a range of the optical input power of the first curved line is the same as the range of the optical input power of the second curved line and the range of the drive voltage of the first curved line is the same as the range of the drive voltage of the second curved line and generate a target curved line representing a relationship between optical input power and a drive voltage of the optical amplifier for obtaining a target output level through interpolation based on the first and second curved lines at least one of which is corrected;
    a determiner configured to determine a drive voltage corresponding to the optical power detected by the detector; and
    a drive circuit configured to drive the optical amplifier using the drive voltage determined by the determiner.

2. The optical output level control apparatus according to claim 1, further comprising:
    a target data memory configured to store data used to define the target curved line generated by the generator,
    wherein the determiner determines the drive voltage corresponding to the optical power detected by the detector by searching the target data memory using the optical power detected by the detector.

3. The optical output level control apparatus according to claim 1,
wherein the generator includes a normalizer configured to normalize the first and second curved lines, an interpolator configured to generate a third curved line from the first and second curved lines normalized by the normalizer through interpolation, and a target curved line generator configured to generate the target curved line by denormalizing the third curved line generated by the interpolator.

4. The optical output level control apparatus according to claim 3,
wherein the interpolator generates the third curved line from the first and second curved lines through interpolation in a ratio determined by the first output level, the second output level, and the target output level.

5. The optical output level control apparatus according to claim 3,
wherein the memory further stores data indicating end points of an intermediate curved line representing a relationship between optical input power and the drive voltage of the optical amplifier for obtaining an intermediate output level between the first output level and the second output level,
wherein the end points of the intermediate curved line are located on one of a straight line indicating an upper limit of the drive voltage of the optical amplifier, a straight line indicating a minimum optical power detectable by the detector, and a straight line indicating a maximum optical power detectable by the detector, and
wherein the target curved line generator generates the target curved line from the third curved line using the data that indicate the end points of the intermediate curved line and that are stored in the memory.

6. A method for generating a lookup table for use in an optical output level control apparatus, the optical output level control apparatus including a detector configured to detect optical power of an input optical signal, an optical amplifier configured to amplify the input optical signal, and a drive circuit configured to drive the optical amplifier using a drive voltage corresponding to the optical power detected by the detector, the method comprising:
correcting, using at least one processor, at least one of a first curved line representing a relationship between the optical input power and a drive voltage of the optical amplifier for obtaining a first output level and a second curved line representing a relationship between the optical input power and the drive voltage of the optical amplifier for obtaining a second output level so that a range of the optical input power of the first curved line is the same as a range of the optical input power of the second curved line and a range of the drive voltage of the first curved line is the same as a range of the drive voltage of the second curved line;
generating, using the at least one processor, a target curved line representing a relationship between optical input power and a drive voltage of the optical amplifier for obtaining a target output level through interpolation based on the first and second curved lines at least one of which is corrected; and
storing, using the at least one processor, data that define the target curved line in a storage area so that a drive voltage of the optical amplifier is searchable using the optical input power.

* * * * *